(12) United States Patent
Endo (10) Patent No.: US 10,741,463 B2
(45) Date of Patent: Aug. 11, 2020

(54) SHIELDED MODULE

(71) Applicant: Murata Manufacturing Co., Ltd., Kyoto (JP)

(72) Inventor: Shigeru Endo, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/995,534

(22) Filed: Jun. 1, 2018

(65) Prior Publication Data

US 2018/0277457 A1 Sep. 27, 2018

Related U.S. Application Data

(63) Continuation of application No. PCT/JP2016/085723, filed on Dec. 1, 2016.

(30) Foreign Application Priority Data

Dec. 4, 2015 (JP) .................. 2015-237996

(51) Int. Cl.
*H01L 23/552* (2006.01)
*H01L 23/28* (2006.01)
(Continued)

(52) U.S. Cl.
CPC .............. *H01L 23/28* (2013.01); *H01L 23/04* (2013.01); *H01L 23/552* (2013.01); *H01P 3/08* (2013.01);
(Continued)

(58) Field of Classification Search
CPC ............ H01L 24/97; H01L 2924/3045; H01L 2224/73265; H01L 2224/83; H01L 24/45;
(Continued)

(56) References Cited

U.S. PATENT DOCUMENTS 6,566,596 B1 * 5/2003 Askew ................ H01L 23/3135
174/391
8,199,518 B1 6/2012 Chun et al.
(Continued)

FOREIGN PATENT DOCUMENTS

JP 2007-129304 A 5/2007
JP 2007-329735 A 12/2007
(Continued)

OTHER PUBLICATIONS

International Search Report for International Application No. PCT/JP2016/085723, dated Jan. 24, 2017.
Written Opinion for International Application No. PCT/JP2016/085723, dated Jan. 24, 2017.

*Primary Examiner* — S. V. Clark
(74) *Attorney, Agent, or Firm* — Pearne & Gordon LLP (57) ABSTRACT

A module 1a includes a multilayer wiring board 2, a component 3 that is mounted on a main surface 2a of the multilayer wiring board 2, a sealing-resin layer 4 that is laminated on the main surface 2a of the multilayer wiring board 2, and a resin coating layer 7 that coats a surface of the sealing-resin layer 4. The resin coating layer 7 includes a shield film 5 and outer electrodes 6, and opposite surfaces 6a of the outer electrodes 6 and an opposite surface 5a of the shield film 5 are formed on the same plane. The module 1a can be connected to, for example, an external antenna without using a wiring electrode of a mother substrate, and thus, signal loss can be suppressed.

10 Claims, 4 Drawing Sheets

(51) Int. Cl.
*H01L 23/04* (2006.01)
*H01P 3/08* (2006.01)
*H05K 9/00* (2006.01)
*H01L 23/31* (2006.01)

(52) U.S. Cl.
CPC ......... *H05K 9/0009* (2013.01); *H05K 9/0015* (2013.01); *H05K 9/0073* (2013.01); *H01L 23/3107* (2013.01); *H01L 2223/6677* (2013.01); *H01L 2924/10253* (2013.01); *H01L 2924/10329* (2013.01); *H01L 2924/181* (2013.01); *H01L 2924/3025* (2013.01)

(58) Field of Classification Search
CPC ........... H01L 24/124; H01L 2223/6677; H01L 23/60; H01L 24/32
USPC .................................................. 257/659, 704
See application file for complete search history.

(56) References Cited

U.S. PATENT DOCUMENTS

| | | | | |
|---|---|---|---|---|
| 2005/0093111 | A1* | 5/2005 | Berman | H01L 23/552 257/664 |
| 2008/0296717 | A1* | 12/2008 | Beroz | H01L 23/552 257/434 |
| 2010/0320577 | A1* | 12/2010 | Pagaila | H01L 21/565 257/659 |
| 2012/0306061 | A1* | 12/2012 | Tabatabai | H01L 23/552 257/659 |
| 2013/0222401 | A1 | 8/2013 | Ito et al. | |
| 2014/0325150 | A1* | 10/2014 | Hashimoto | H01L 23/552 711/115 |

FOREIGN PATENT DOCUMENTS

JP 2013-179151 A 9/2013
WO 2016/158338 A1 10/2016

* cited by examiner

SHIELDED MODULE

This is a continuation of International Application No. PCT/JP2016/085723 filed on Dec. 1, 2016 which claims priority from Japanese Patent Application No. 2015-237996 filed on Dec. 4, 2015. The contents of these applications are incorporated herein by reference in their entireties.

BACKGROUND OF THE DISCLOSURE

Field of the Disclosure

The present disclosure relates to a module including a sealing-resin layer that coats a plurality of components mounted on a wiring board, a shield film for reducing a probability of the entry of electromagnetic waves from the outside and a probability of the leakage of electromagnetic waves to the outside, and an outer electrode for external connection.

Description of the Related Art

There is a case where a high-frequency module that is included in, for example, a mobile terminal device is provided with a shield film for blocking unnecessary electromagnetic waves. As an example of this type of high-frequency module, there is a high-frequency module in which a component mounted on a wiring board is coated with a mold resin and in which a shield film is provided so as to coat the surface of the mold resin.

In the case of mounting such a module onto, for example, a mother substrate, an outer electrode for external connection is generally disposed on a bottom surface (a surface that faces the mother substrate). Accordingly, in the case of connecting the outer electrode to, for example, an antenna, a chip antenna is mounted onto the mother substrate, or a film antenna is connected to the mother substrate, and the antenna is connected to the outer electrode of the module via a wiring electrode of the mother substrate. With such a configuration, a high-frequency communication signal sent out by the module is transmitted by the antenna via the wiring electrode of the mother substrate, which results in a large signal loss. In addition, since the wiring electrode is formed in the mother substrate, there is a problem in that a mounting area of the mother substrate is increased.

Figure 6:
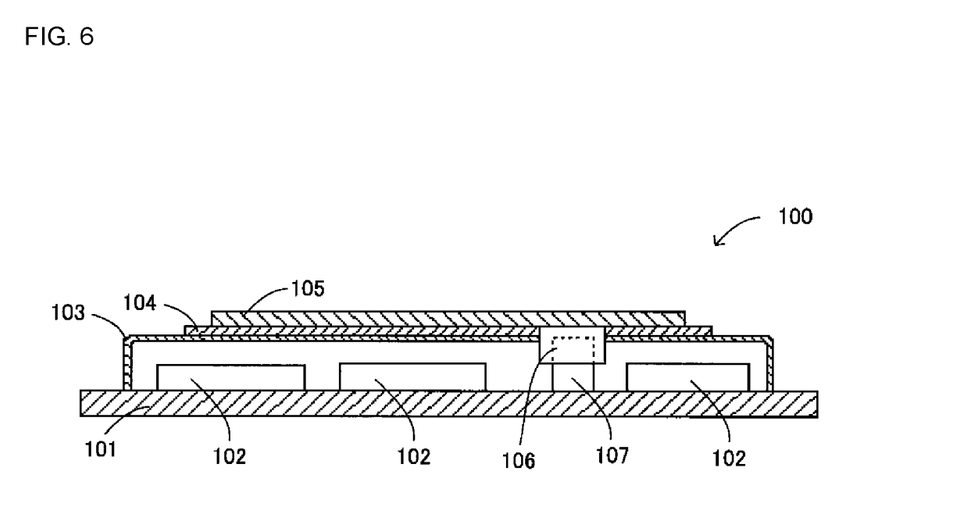
FIG. 6 is a sectional view of a communication module of the related art.

Accordingly, there has been proposed a module that is capable of being connected to, for example, an external antenna without using a wiring electrode of a mother substrate. For example, as illustrated in FIG. 6, a communication module 100 described in Patent Document 1 includes three wireless communication circuits 102 formed on a wiring board 101, a shield case 103 that is provided so as to cover the wireless communication circuits 102, a spacer 104 that is disposed along the outer surface of the shield case 103, an antenna 105 that is disposed along the outer surface of the spacer 104, and high-frequency connectors 106 and 107 that electrically connect the antenna 105 and the wiring board 101 to each other.

In this case, a planar installation space of the shield case 103 can be effectively used, and a reduction in the size of the communication module 100 can be achieved. In addition, the high-frequency connector 106 is integrally formed with the antenna 105, and the high-frequency connector 107 is capable of being mounted onto and unmounted from the high-frequency connector 106 and is mounted on the wiring board 101. Thus, the antenna 105 and the wiring board 101 can be electrically connected to each other with certainty.

Patent Document 1: Japanese Unexamined Patent Application Publication No. 2007-329735 (see [0013] to [0019], FIG. 1, and so forth)

BRIEF SUMMARY OF THE DISCLOSURE

With the recent reduction in the sizes of electronic devices, there has been a demand for further reductions in the sizes and the heights of modules that are mounted in or on such electronic devices. However, in order to connect the above-mentioned communication module 100 to the antenna 105, it is necessary to cause an end portion of the high-frequency connector 106 to project to the outside of the shield case 103, and thus, it is difficult to reduce the height of the communication module 100.

The present disclosure has been made in view of the above-described problem, and it is an object of the present disclosure to provide a module capable of reducing signal loss and capable of being reduced in size.

To achieve the above-described object, a module according to the present disclosure includes a wiring board, a component that is mounted on a main surface of the wiring board, a sealing-resin layer that is laminated on the main surface of the wiring board and that seals the component, and a resin coating layer that is laminated on the sealing-resin layer so as to coat a surface of the sealing-resin layer. The resin coating layer includes a shield film and an outer electrode that is electrically connected to the wiring board. A first surface of the outer electrode, the first surface being opposite to a second surface of the outer electrode that faces the sealing-resin layer, and a first surface of the shield film, the first surface being opposite to a second surface of the shield film that faces the sealing-resin layer, are located on the same plane, or the first surface of the outer electrode is located closer to the sealing-resin layer than the plane is.

With such a configuration, the module can be connected to, for example, an external antenna without using a wiring electrode of a mother substrate, and thus, signal loss can be suppressed. In addition, since the first surface of the outer electrode and the first surface of the shield film are located on the same plane, or the first surface of the outer electrode is located closer to the sealing-resin layer than the first surface of the shield film, a reduction in the height of the module can be achieved, and in addition, the handleability of the module when being processed and when being mounted is improved.

The shield film may further include an overlap portion that is disposed between the outer electrode and the sealing-resin layer and overlaps the outer electrode when viewed in a direction perpendicular to the first surface of the outer electrode. In this case, the component mounted on the wiring board can be shielded with certainty, and thus, the interference by electromagnetic waves can be suppressed.

An insulating material may be disposed in a gap between the outer electrode and the shield film. In this case, the insulation between the outer electrode and the shield can be improved.

An insulating material may be disposed so as to cover a peripheral edge portion of the first surface of the outer electrode. In this case, the insulation between the outer electrode and the shield can be improved, and the outer electrode can be prevented from coming off.

The outer electrode may be connected to an antenna. With this configuration, for example, when a film antenna is disposed on the inside of a cover of a communication device, the antenna and the module can be connected to each other by closing the cover of the communication device, and thus, a process of mounting and connecting a connector is not necessary.

According to the present disclosure, a module can be connected to, for example, an external antenna without using a wiring electrode of a mother substrate, and thus, signal loss can be suppressed. In addition, since the first surface of the outer electrode and the first surface of the shield film are located on the same plane, or the first surface of the outer electrode is located closer to the sealing-resin layer than the first surface of the shield film, a reduction in the height of the module can be achieved, and in addition, the handleability of the module when being processed and when being mounted is improved.

DETAILED DESCRIPTION OF THE DISCLOSURE

First Embodiment

A module 1a according to a first embodiment of the present disclosure will be described with reference to FIG. 1 to FIGS. 3A-3D. Note that FIG. 1 is a perspective view of the module 1a, each of FIGS. 2A and 2B is a sectional view of the module 1a, and each of FIGS. 3A-3D is a partial sectional view illustrating one of outer electrodes 6 of the module 1a.

Figure 1:
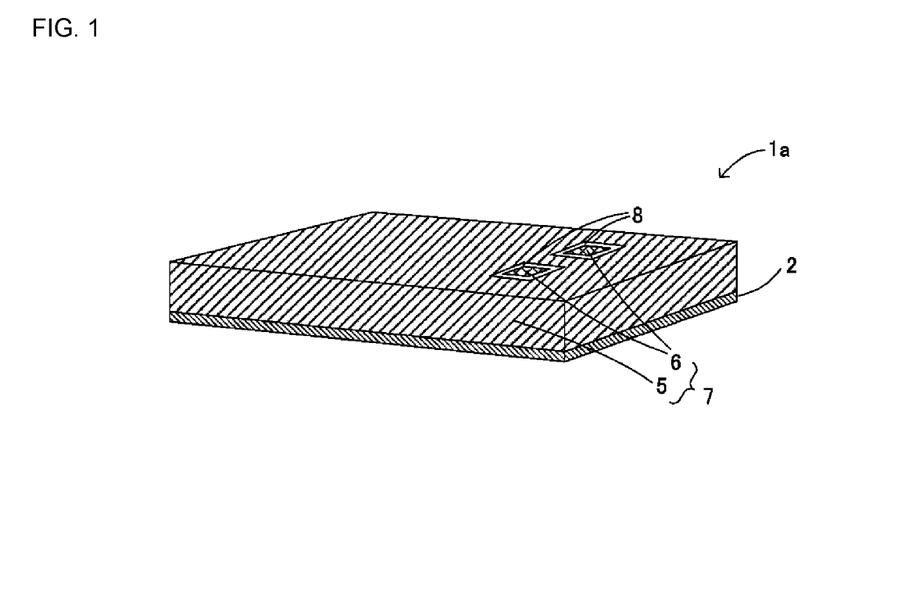
FIG. 1 is a perspective view of a module according to a first embodiment of the present disclosure.
Figure 2A:
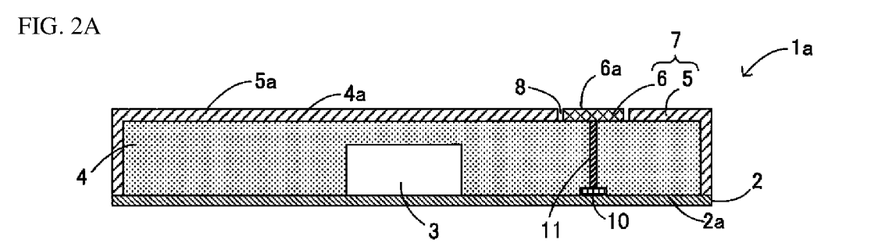
FIGS. 2A and 2B Each of FIGS. 2A and 2B is a sectional view of the module according to the first embodiment of the present disclosure.
Figure 2B:
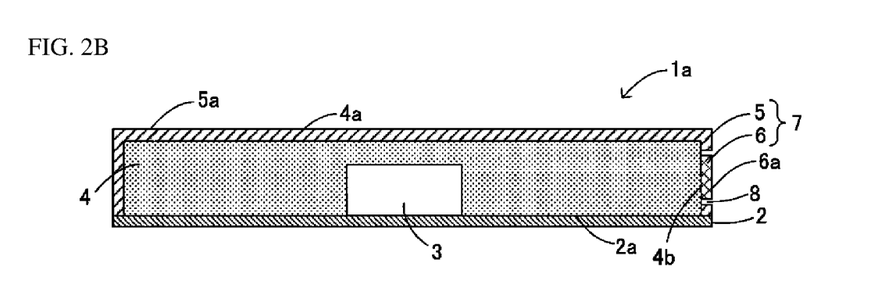

As illustrated in FIG. 1 and FIG. 2A, the module 1a according to the first embodiment includes a multilayer wiring board 2 (corresponding to a wiring board according to the present disclosure), a component 3 that is mounted on a main surface 2a of the multilayer wiring board 2, a sealing-resin layer 4 that is laminated on the main surface 2a of the multilayer wiring board 2, and a resin coating layer 7 that coats the surfaces of the sealing-resin layer 4. The module 1a is connected to, for example, an antenna via the outer electrodes 6, which are included in the resin coating layer 7, and is mounted onto an antenna of an electronic device such as a smartphone.

For example, the multilayer wiring board 2 is formed of a plurality of insulating layers (not illustrated) that are made of, for example, a low-temperature co-fired ceramic or a glass epoxy resin and that are laminated together. A mount electrode (not illustrated) used for mounting the component 3, connecting electrodes 10, and so forth are formed on the main surface 2a of the multilayer wiring board 2. Note that the wiring board may have a single-layer structure.

The component 3 is formed of a semiconductor device made of a semiconductor such as Si or GaAs or a chip component such as a chip inductor, a chip capacitor, or a chip resistor.

The sealing-resin layer 4 is laminated on the multilayer wiring board 2 so as to coat the main surface 2a of the multilayer wiring board 2 and the component 3. The sealing-resin layer 4 can be made of a resin, such as an epoxy resin, that is typically used as a sealing resin.

The resin coating layer 7 includes a shield film 5 and the outer electrodes 6, and is formed so as to coat the surfaces of the sealing-resin layer 4. The shield film 5 is provided in order to shield wiring electrodes (not illustrated) disposed in the multilayer wiring board 2 and the component 3 against noise from the outside. The shield film 5 can be formed so as to have a multilayer structure formed of, for example, a close-contact film (not illustrated) that is laminated on the surfaces of the sealing-resin layer 4, an electroconductive film (not illustrated) that is laminated on the close-contact film, and a protective film (not illustrated) that is laminated on the electroconductive film.

The close-contact film is provided in order to improve the adhesion strength between the electroconductive film and the sealing-resin layer 4 and can be made of, for example, a metallic material such as SUS. The electroconductive film is a layer that serves to provide a substantial shielding function of the shield film 5 and can be made of, for example, any one of metals, which are Cu, Ag, and Al. The protective film is provided in order to prevent the corrosion of the electroconductive film and the formation of scratches on the electroconductive film and can be made of, for example, SUS.

Note that the shield film 5 is connected to a ground electrode (not illustrated) that is exposed at a side surface of the multilayer wiring board 2.

For example, the outer electrodes 6 are disposed at positions at which the outer electrodes 6 coat portions of a top surface 4a of the sealing-resin layer 4. The shield film 5 is provided so as to coat the surfaces of the sealing-resin layer 4 excluding the portions of the surfaces of the sealing-resin layer 4 on which the outer electrodes 6 are disposed, that is, the shield film 5 is provided so as to coat a portion of the top surface 4a of the sealing-resin layer 4 surrounding the outer electrodes 6 and the side surfaces of the sealing-resin layer 4. The sealing-resin layer 4 is exposed at the top surface of the module 1a between the outer electrodes 6 and the shield film 5, and the outer electrodes 6 and the shield film 5 are electrically isolated from each other. The outer electrodes 6 are in contact with upper ends of columnar conductors 11 (e.g., via conductors) extending through the sealing-resin layer 4 and are electrically connected to the connecting electrodes 10 formed on the main surface 2a of the multilayer wiring board 2 via the columnar conductors 11.

The outer electrodes 6 are formed such that surfaces 6a of the outer electrodes 6 (hereinafter sometimes referred to as opposite surfaces 6a of the outer electrodes 6) opposite to the surfaces of the outer electrodes 6 that face the sealing-resin layer 4, and a surface 5a of the shield film 5 (hereinafter sometimes referred to as an opposite surface 5a of the shield film 5) opposite to a surface of the shield film 5 that faces the sealing-resin layer 4, are on substantially the same plane. Note that the outer electrodes 6 can be made of the same material as the shield film 5 or a metal, such as Cu, Ag, or Al, that is typically used as a material of a wiring electrode. Nickel plating and gold plating may be performed on the surfaces of the outer electrodes 6. Note that, in the first embodiment, the outer electrodes 6 are made of the same material as the shield film 5, that is, each of the outer electrodes 6 is formed so as to have a three-layer structure formed of a close-contact film, an electroconductive film, and a protective film. In addition, as illustrated in FIG. 2B, one of the outer electrodes 6 may be formed on a side surface 4b of the sealing-resin layer 4.

(Method of Manufacturing Module)

A method of manufacturing the module 1a will now be described. First, the multilayer wiring board 2 that includes various wiring electrodes, via conductors, and so forth formed therein is prepared, and the component 3 is mounted onto the main surface 2a of the multilayer wiring board 2 by using a commonly known surface mount technology. The columnar conductors 11 that are formed of metal pins are mounted such that an end surface of each of the columnar conductors 11 is in contact with a corresponding one of the connecting electrodes 10, which are formed on the main surface 2a of the multilayer wiring board 2. Each of the metal pins can be formed by, for example, shearing a wire member made of a metal such as Cu, Ag, or Al.

Next, the sealing-resin layer 4 is laminated on the main surface 2a of the multilayer wiring board 2 so as to coat the component 3 and the columnar conductors 11. The sealing-resin layer 4 can be formed by, for example, an application method, a printing method, a compression molding method, a transfer molding method, or the like. In addition, in order to make the surface of the sealing-resin layer 4 flat, the surface of the sealing-resin layer 4 is polished or ground. In this case, the surface of the sealing-resin layer 4 is polished or ground such that the other end surface of each of the columnar conductors 11 is exposed at the surface of the sealing-resin layer 4. Note that, instead of forming the columnar conductors 11 by using the metal pins, the columnar conductors 11 may be formed by forming holes in the sealing-resin layer 4 by, for example, drilling or laser processing after the sealing-resin layer 4 has been laminated and then injecting, for example, an electrically conductive paste containing a Cu filler into the holes by, for example, an application method or a printing method such that the holes are filled with the electrically conductive paste.

Next, the shield film 5 having the above-mentioned three-layer structure is deposited by using a sputtering apparatus or a vacuum deposition apparatus so as to coat a top surface of the sealing-resin layer 4 and a side surface of the sealing-resin layer 4.

Next, the outer electrodes 6 are formed by cutting out portions of the shield film 5. In this case, as illustrated in FIG. 2A, grooves 8 are formed from the surface 5a of the shield film 5 by, for example, drilling or laser processing, and portions that correspond to the outer electrodes 6 are isolated from the shield film 5. As a result, the surfaces 6a of the outer electrodes 6, which are opposite to the surfaces of the outer electrodes 6 facing the sealing-resin layer 4, and the opposite surface 5a of the shield film 5 can be located on substantially the same plane.

Note that the method of forming the outer electrodes 6 can be suitably changed. For example, when the shield film 5 is deposited, masks may be placed on portions at which the outer electrodes 6 are to be disposed, and the masks may be removed after the shield film 5 has been formed. Then, the outer electrodes 6 may be formed at portions of the resin coating layer 7 at which the shield film 5 is not formed by, for example, a printing method or the like. In this case, the outer electrodes 6 can be made of a metal, such as Cu, Ag, or Al, that is typically used as a material of a wiring electrode.

Therefore, according to the above-described first embodiment, the module 1a can be connected to, for example, an external antenna without using wiring electrodes of a mother substrate, and thus, signal loss can be suppressed. In addition, since the opposite surfaces 6a of the outer electrodes 6 and the opposite surface 5a of the shield film 5 are located on substantially the same plane, a reduction in the height of the module can be achieved, and the handleability of the module when being processed and when being mounted is improved. Furthermore, since it is not necessary to mount the outer electrodes 6 onto the mother substrate, a mounting area of the mother substrate can be decreased.

(Modification of Outer Electrodes)

A modification of the arrangement of the outer electrodes will now be described with reference to FIGS. 3A-3D. Note that each of FIGS. 3A-3D is a partial sectional view illustrating a modification of one of the outer electrodes 6 of the module 1a. Note that the columnar conductors 11 are not illustrated in FIGS. 3A-3D.

Figure 3A:
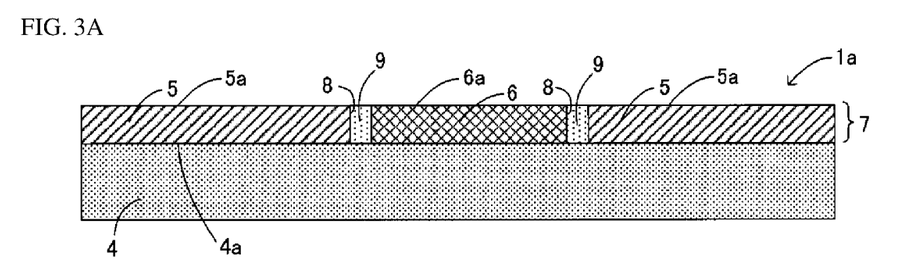
FIGS. 3A-3D Each of FIGS. 3A-3D is a partial sectional view illustrating a modification of the arrangement of an outer electrode illustrated in FIGS. 2A and 2B.
Figure 3B:
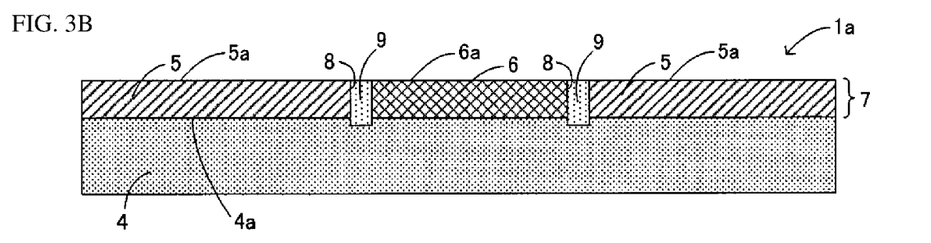

As illustrated in FIG. 3A, an insulating material 9 may be placed in the grooves 8, each of which isolates the shield film 5 and a corresponding one of the outer electrodes 6 from each other. As the insulating material 9, for example, an insulating resin such as an epoxy resin or a thermoplastic resin can be used. In this case, the insulation between the outer electrodes 6 and the shield film 5 can be improved. As illustrated in FIG. 3B, each of the grooves 8 may reach the inside of the sealing-resin layer 4. In this case, when each of the outer electrodes 6 is isolated from the shield film 5, the electrical connection between the shield film 5 and the outer electrode 6 can be cut with certainty, and thus, the insulation can be further improved.

Figure 3C:
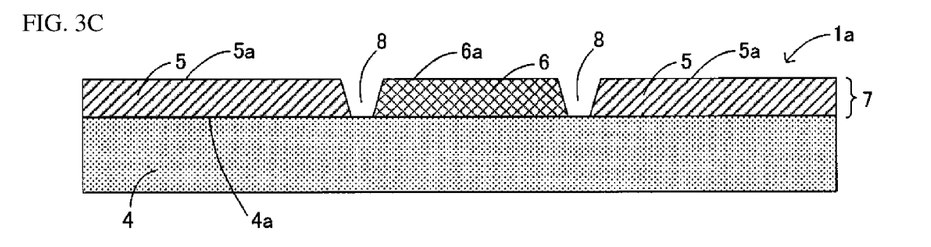
Figure 3D:
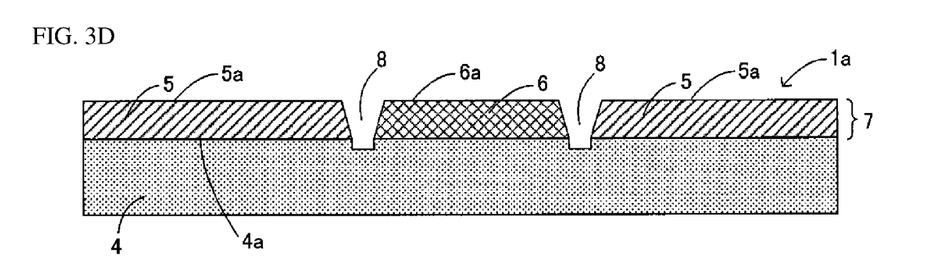

Alternatively, as illustrated in FIG. 3C, each of the grooves 8 may be processed into a tapered shape. Furthermore, as illustrated in FIG. 3D, each of the grooves 8 processed in a tapered shape may reach the inside of the sealing-resin layer 4. Note that, in order to process each of the grooves 8 into a tapered shape, for example, laser processing may be used.

Second Embodiment

A module according to a second embodiment of the present disclosure will now be described with reference to FIGS. 4A-4C. Note that each of FIGS. 4A-4C illustrates an arrangement example of one of the outer electrodes 6 in a module 1b.

Figure 4A:
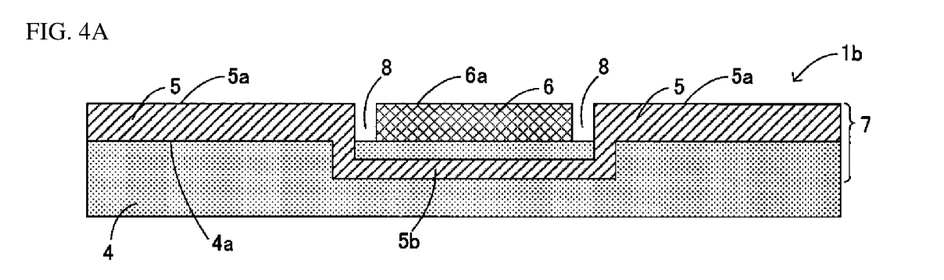
FIGS. 4A-4C Each of FIGS. 4A-4C is a partial sectional view illustrating an arrangement example of an outer electrode according to a second embodiment.
Figure 4B:
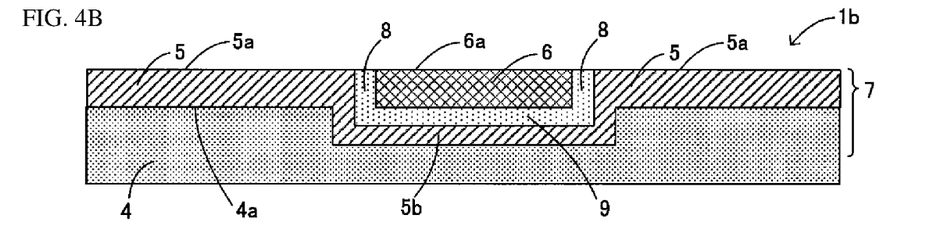
Figure 4C:
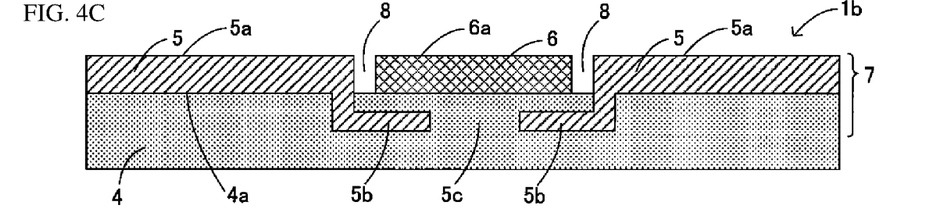

The difference between the module 1b according to the second embodiment and the module 1a according to the first embodiment, which has been described with reference to FIG. 1 to FIGS. 3A-3D, is that the shield film 5 includes overlap portions 5b that overlap the outer electrodes 6 as illustrated in FIGS. 4A-4C when viewed in a direction perpendicular to the opposite surfaces 6a of the outer electrodes 6. The rest of the configuration of the module 1b is the same as that of the module 1a according to the first embodiment, and thus, the same reference numerals will be used, and the description thereof will be omitted.

As illustrated in FIG. 4A, one of the overlap portions 5b of the shield film 5 is disposed between a corresponding one of the outer electrodes 6 and the sealing-resin layer 4. For example, a resin that is the same as the sealing-resin layer 4 is provided between each of the outer electrodes 6 and the overlap portion 5b, so that the insulation between the outer electrode 6 and the overlap portion 5b is ensured. In this case, each of the outer electrodes 6 is not directly connected to a corresponding one of the columnar conductors (see FIG.

2A), which are connected to the multilayer wiring board 2 (see FIGS. 2A and 2B), and is connected to the columnar conductor 11 via an extended wiring line. In this case, for example, the outer electrode 6 may be extended to a position that is not directly under the outer electrode 6 by using the extended wiring line and may be connected to the columnar conductor 11 at the position to which the outer electrode 6 is extended. As a result, when viewed in the direction perpendicular to the opposite surfaces 6a of the outer electrodes 6, the overlap portions 5b of the shield film 5 can overlap the entire outer electrodes 6.

With this configuration, since portions of the shield film 5 (the overlap portions 5b) are arranged at positions that are directly under the outer electrodes 6 and that serve as signal inlet and outlet ports, the component 3 mounted on the multilayer wiring board 2 can be shielded with certainty.

In addition, as illustrated in FIG. 4B, the insulating material 9 may be placed in the grooves 8 and the gaps between the outer electrodes 6 and the overlap portions 5b of the shield film 5. In this case, the insulating material 9 may be an insulating resin that is different from the sealing-resin layer 4. With this configuration, the insulation between the outer electrodes 6 and the shield film 5, and between the outer electrodes 6 and the overlap portions 5b can be improved.

As illustrated in FIG. 4C, cavities 5c may be formed in the overlap portions 5b at positions that are superposed with the outer electrodes 6 when viewed in the direction perpendicular to the opposite surfaces 6a of the outer electrodes 6. With this configuration, the columnar conductors 11 can be disposed in the cavities 5c, and the outer electrodes 6 can be directly connected to the connecting electrodes 10 while the shielding performance is maintained.

Third Embodiment

A module 1c according to a third embodiment of the present disclosure will now be described with reference to FIGS. 5A and 5B. Note that each of FIGS. 5A and 5B illustrates an arrangement example of one of the outer electrodes 6.

Figure 5A:
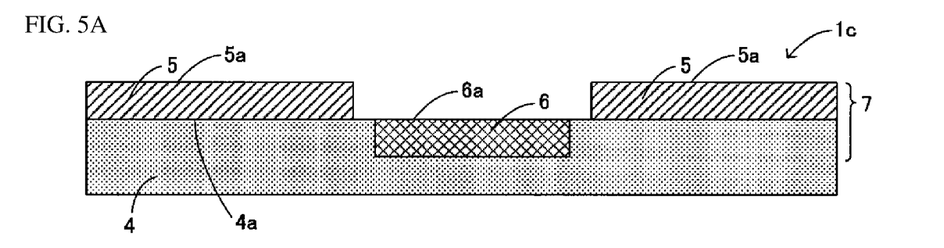
FIGS. 5A and 5B Each of FIGS. 5A and 5B is a partial sectional view illustrating an arrangement example of an outer electrode according to a third embodiment.
Figure 5B:
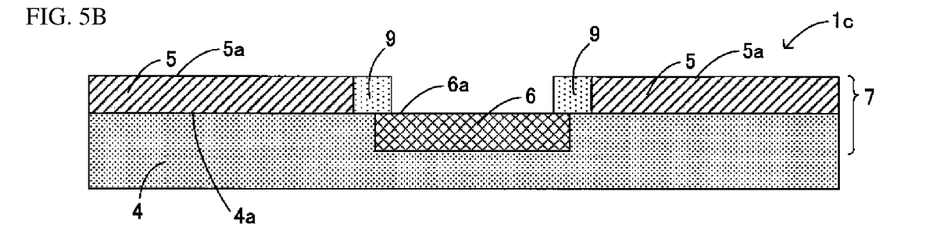

The difference between the module 1c according to the third embodiment and the module 1a according to the first embodiment, which has been described with reference to FIG. 1 to FIGS. 3A-3D, is that, as illustrated in FIGS. 5A and 5B, the outer electrodes 6 are embedded in the sealing-resin layer 4 and that the opposite surfaces 6a of the outer electrodes 6 are located closer to the sealing-resin layer 4 than the opposite surface 5a of the shield film 5. The rest of the configuration of the module 1c is the same as that of the module 1a according to the first embodiment, and thus, the same reference numerals will be used, and the description thereof will be omitted.

In this case, as illustrated in FIG. 5A, each of the outer electrodes 6 is embedded in the sealing-resin layer 4, and the opposite surface 6a of the outer electrode 6 is exposed at the surface of the sealing-resin layer 4. Also with this configuration, advantageous effects similar to those of the module according to the first embodiment can be obtained. As illustrated in FIG. 5B, a peripheral edge portion of the opposite surface 6a of each of the outer electrodes 6 may be covered with the insulating material 9. With this configuration, each of the outer electrodes 6 can be prevented from coming off. Although not illustrated, in FIGS. 5A and 5B, the columnar conductors 11 are disposed below the sealing-resin layer 4, and the bottom surfaces of the outer electrodes 6 are in contact with the corresponding columnar conductors 11.

Note that the present disclosure is not limited to the above-described embodiments, and various changes other than those described above can be made within the scope of the present disclosure. For example, the above-described embodiments may be combined with one another.

For example, although the outer electrode 6 is connected to an antenna in the above embodiments, the outer electrodes 6 may be connected to, for example, a switch or a sensor.

The present disclosure can be applied to various high-frequency modules each of which includes a sealing-resin layer that coats a plurality of components mounted on a wiring board and a shield film that shields a wiring electrode in the wiring board and the components against noise from the outside.

1a to 1c module
2 multilayer wiring board (wiring board)
3 component
4 sealing-resin layer
5 shield film
6 outer electrode
7 resin coating layer
9 insulating material

The invention claimed is:

1. A module comprising:
   a wiring board;
   a component mounted on a main surface of the wiring board;
   a sealing-resin layer laminated on the main surface of the wiring board and sealing the component; and
   a resin coating layer laminated on the sealing-resin layer so as to coat a surface of the sealing-resin layer,
   wherein the resin coating layer includes a shield film and an outer electrode electrically connected to the wiring board, and
   wherein the outer electrode has a first surface and a second surface opposite to the first surface and facing to the sealing-resin layer, and the shield film has a first surface and a second surface opposite to the first surface and facing to the sealing-resin layer, and
   wherein the first surface of the outer electrode is substantially flush with the first surface of the shield film.

2. The module according to claim 1,
   wherein the shield film further includes an overlap portion disposed between the outer electrode and the sealing-resin layer and overlapping with the outer electrode when viewed in a direction perpendicular to the first surface of the outer electrode.

3. The module according to claim 1,
   wherein an insulating material is disposed in a gap between the outer electrode and the shield film.

4. The module according to claim 1,
   wherein an insulating material is disposed so as to cover a peripheral edge portion of the first surface of the outer electrode.

5. The module according to claim 1,
   wherein the outer electrode is connected to an antenna.

6. The module according to claim 2,
   wherein an insulating material is disposed in a gap between the outer electrode and the shield film.

7. The module according to claim 2,
   wherein the outer electrode is connected to an antenna.

8. The module according to claim 3,
   wherein the outer electrode is connected to an antenna.

9. The module according to claim 4,
wherein the outer electrode is connected to an antenna.

10. A module comprising:

a wiring board;

a component mounted on a main surface of the wiring board;

a sealing-resin layer laminated on the main surface of the wiring board and sealing the component; and a resin coating layer laminated on the sealing-resin layer so as to coat a surface of the sealing-resin layer, wherein the resin coating layer includes a shield film and an outer electrode electrically connected to the wiring board, and wherein the outer electrode has a first surface and a second surface opposite to the first surface and facing to the sealing-resin layer, and the shield film has a first surface and a second surface opposite to the first surface and facing to the sealing-resin layer, and wherein the first surface of the outer electrode is located closer to the sealing-resin layer than the first surface of the shield film.

* * * * *

UNITED STATES PATENT AND TRADEMARK OFFICE
CERTIFICATE OF CORRECTION

PATENT NO.        : 10,741,463 B2
APPLICATION NO.   : 15/995534
DATED             : August 11, 2020
INVENTOR(S)       : Shigeru Endo It is certified that error appears in the above-identified patent and that said Letters Patent is hereby corrected as shown below:

In the Specification

Column 6, Line 67, "columnar conductors (see Fig." should be -- columnar conductors 11 (see Fig --.

Signed and Sealed this
Ninth Day of March, 2021

Drew Hirshfeld
*Performing the Functions and Duties of the*
*Under Secretary of Commerce for Intellectual Property and*
*Director of the United States Patent and Trademark Office*